US009524007B2

(12) United States Patent
Rosik et al.

(10) Patent No.: US 9,524,007 B2
(45) Date of Patent: Dec. 20, 2016

(54) DIAGNOSTIC SYSTEMS AND METHODS OF FINITE STATE MACHINES

(71) Applicant: QUALCOMM Incorporated, San Diego, CA (US)

(72) Inventors: Raymond Keith Rosik, San Diego, CA (US); Steven M. Bidermann, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 200 days.

(21) Appl. No.: 14/172,090

(22) Filed: Feb. 4, 2014

(65) Prior Publication Data

US 2015/0220123 A1 Aug. 6, 2015

(51) Int. Cl.
| | |
|---|---|
| *G06F 1/26* | (2006.01) |
| *G06F 1/24* | (2006.01) |
| *G01R 19/165* | (2006.01) |
| *G06F 11/22* | (2006.01) |

(52) U.S. Cl.
CPC ........... *G06F 1/24* (2013.01); *G01R 19/16552* (2013.01); *G06F 1/26* (2013.01); *G06F 11/2268* (2013.01)

(58) Field of Classification Search
CPC .. G01R 19/16552; G06F 11/2268; G06F 1/24; G06F 1/26
See application file for complete search history.

(56) References Cited

U.S. PATENT DOCUMENTS

| | | | | |
|---|---|---|---|---|
| 4,253,173 A | * | 2/1981 | Jaunin | G04C 3/14 368/185 |
| 4,907,150 A | * | 3/1990 | Arroyo | G06F 1/26 713/323 |
| 6,628,660 B1 | | 9/2003 | Morse | |
| 7,551,009 B2 | | 6/2009 | Garlapati et al. | |
| 8,161,366 B2 | | 4/2012 | Pothireddy et al. | |
| 8,892,859 B1 | * | 11/2014 | Eny | G06F 11/1441 377/82 |
| 2002/0104031 A1 | | 8/2002 | Tomlinson et al. | |
| 2006/0075312 A1 | * | 4/2006 | Fischer | G06F 21/74 714/48 |
| 2006/0284655 A1 | | 12/2006 | Li et al. | |

(Continued)

OTHER PUBLICATIONS

International Search Report and Written Opinion—PCT/US2015/014264—ISA/EPO—Apr. 2, 2015.

*Primary Examiner* — Thomas Lee
*Assistant Examiner* — Mohammad A Rahman
(74) *Attorney, Agent, or Firm* — Haynes and Boone, LLP (57) ABSTRACT

In one embodiment, a power management integrated circuit comprises a finite state machine having a first terminal to receive a digital command signal, a second terminal to receive a clock signal, and a third terminal to receive a first reset signal to reset the finite state machine into a predetermined operational state. A plurality of diagnostic registers is configured to store a signal state of the digital command signal or a clock state of the clock signal, or both in response to the first reset signal. The diagnostic registers are configured to maintain the signal state or the clock state, or both after powering down of the power management integrated circuit in response to the first reset signal. The diagnostic registers are configured to allow retrieval of the stored signal state or the stored clock state, or both upon power on of the power management integrated circuit.

11 Claims, 6 Drawing Sheets

(56) References Cited

U.S. PATENT DOCUMENTS

| | | | |
|---|---|---|---|
| 2007/0233903 A1* | 10/2007 | Pyeon | G11C 7/20 |
| | | | 710/1 |
| 2011/0080143 A1 | 4/2011 | Parakulam et al. | |
| 2013/0044796 A1 | 2/2013 | Haldar et al. | |
| 2013/0305207 A1* | 11/2013 | Hsieh | G06F 17/5009 |
| | | | 716/136 |
| 2014/0313843 A1* | 10/2014 | Nebashi | G06F 1/30 |
| | | | 365/227 |

* cited by examiner

DIAGNOSTIC SYSTEMS AND METHODS OF FINITE STATE MACHINES

BACKGROUND

The disclosure relates to systems and methods for providing information for diagnosing internal fault conditions of finite state machines.

Unless otherwise indicated herein, the approaches described in this section are not admitted to be prior art by inclusion in this section.

Electronic devices, such as power management devices, often include multiple finite states machines (FSM) for power up, autonomous charging, or other functions based on input supplies and digital command signals. These finite state machines require a valid input clock and proper digital command signals to be present in order to sequence through the intended states to reach a fully powered up state. If any of these clocks or digital command signals are not valid due to rare events within a system environment, the device can become stuck in a fixed state and require a hard reset to recover or battery removal to recover.

Once a power management device, such as a power management integrated circuit (PMIC), is locked into a non-powered up state, there is very limited visibility into the internal state of the device for root cause analysis of any power up issues. Power up issues can often be very rare and intermittent. This can make it very difficult to reproduce the problem, diagnose the root cause, and provide alternative hardware or software solutions to fix the issue. Due to the issues described above, there is a need for an improved diagnostics interface to the PMIC device that allows visibility into internal infrastructure signals during fault conditions.

SUMMARY

The present disclosure describes systems and methods for diagnosing internal fault conditions of finite state machines in power management integrated circuits. In one embodiment, a power management integrated circuit comprises a finite state machine having a first terminal to receive a digital command signal, a second terminal to receive a clock signal, and a third terminal to receive a first reset signal to reset the finite state machine into a predetermined operational state. A plurality of diagnostic registers is configured to store a signal state of the digital command signal or a clock state of the clock signal, or both in response to the first reset signal. The diagnostic registers are configured to maintain the signal state or the clock state, or both after powering down of the power management integrated circuit in response to the first reset signal.

In one embodiment, the diagnostic registers are configured to allow retrieval of the stored signal state or the stored clock state, or both upon power on of the power management integrated circuit.

In one embodiment, the diagnostic registers are configured to allow retrieval of the stored signal state or the stored clock state, or both via a system interface while the power management integrated circuit is powered down.

In one embodiment, the power management integrated circuit further comprises a reset signal generator to generate the first reset signal in response to a loss of main power to the power management integrated circuit.

In one embodiment, the power management integrated circuit further comprises a reset signal generator to generate the first reset signal in response to a user selected power off to the power management integrated circuit.

In one embodiment, the plurality of diagnostic registers is configured to clear the stored signal state or the stored clock state, or both in response to the second reset signal.

In one embodiment, the power management integrated circuit further comprises a reset signal generator to generate the second reset signal in response to a loss of backup power to the power management integrated circuit.

In one embodiment, the power management integrated circuit further comprises a reset signal generator to generate the second reset signal in response to a removal of a battery power to the power management integrated circuit.

In one embodiment, the power management integrated circuit further comprises a halt detector having an input to receive the clock signal and having an output to provide a halt detection signal to at least one diagnostic register to store the clock state in response to detection of a halt of the clock signal.

In one embodiment, the halt detector is an analog clockless circuit.

In another embodiment, a method comprises receiving, on inputs of a finite state machine in a power management integrated circuit, a plurality of digital command signals or one or more clock signals, or both; receiving a reset signal to reset the finite state machine into a predetermined operational state; storing, in response to said reset signal, a plurality of signal states of the plurality of digital command signals or one or more clock states of the one or more clock signals, or both in a plurality of diagnostic registers; and powering down the power management integrated circuit in response to said reset signal. The diagnostic registers maintain the plurality of signal states or the one or more clock states, or both after said powering down of the power management integrated circuit.

In one embodiment, the method further comprises powering on the power management integrated circuit; and retrieving the plurality of signal states and the one or more clock states.

In one embodiment, the method further comprises generating the reset signal in response to a loss of main power to the power management integrated circuit.

In one embodiment, the method further comprises clearing the stored plurality of signal states and the stored one or more clock states in the plurality of diagnostic registers in response to a loss of main power to the power management integrated circuit.

In one embodiment, the method further comprises generating a second reset signal to clear the plurality of signal states or the one or more clock states, or both in the plurality of diagnostic registers in response to a removal of a battery power to the power management integrated circuit.

In one embodiment, the method further comprises providing a halt detection signal to at least one diagnostic register to store the one or more clock states of the one or more clock signals in response to detection of a halt of the clock signal.

In yet another embodiment, a method comprises receiving, on inputs of a finite state machine in an electronic device, a plurality of digital command signals or one or more clock signals, or both; receiving a reset signal to reset the finite state machine into a predetermined operational state; storing, in response to said reset signal, a plurality of signal states of the plurality of digital command signals or the one or more clock signals, or both in a plurality of diagnostic registers; powering down the electronic device in response to said reset signal; and maintaining the plurality of signal states in the diagnostic registers after said powering down of the electronic device.

In one embodiment, the method further comprises powering on the electronic device; and retrieving the plurality of signal states.

In one embodiment, the method further comprises communicating over a system interface with the electronic device in the powered down state; and retrieving the plurality of signal states from the diagnostic registers.

In one embodiment, the method further comprises generating a second reset signal when a battery is removed from the electronic device; and resetting the plurality of diagnostic registers by the second reset signal.

In one embodiment, the method further comprises providing a halt detection signal to at least one diagnostic register to store the signal states of the one or more clock signals in response to detection of a halt of the clock signal.

The following detailed description and accompanying drawings provide a better understanding of the nature and advantages of the present disclosure.

BRIEF DESCRIPTION OF THE DRAWINGS

With respect to the discussion to follow and in particular to the drawings, it is stressed that the particulars shown represent examples for purposes of illustrative discussion, and are presented in the cause of providing a description of principles and conceptual aspects of the present disclosure. In this regard, no attempt is made to show implementation details beyond what is needed for a fundamental understanding of the present disclosure. The discussion to follow, in conjunction with the drawings, make apparent to those of skill in the art how embodiments in accordance with the present disclosure may be practiced. In the accompanying drawings.

DETAILED DESCRIPTION

In the following description, for purposes of explanation, numerous examples and specific details are set forth in order to provide a thorough understanding of the present disclosure. It will be evident, however, to one skilled in the art that the present disclosure as expressed in the claims may include some or all of the features in these examples, alone or in combination with other features described below, and may further include modifications and equivalents of the features and concepts described herein.

Figure 1:
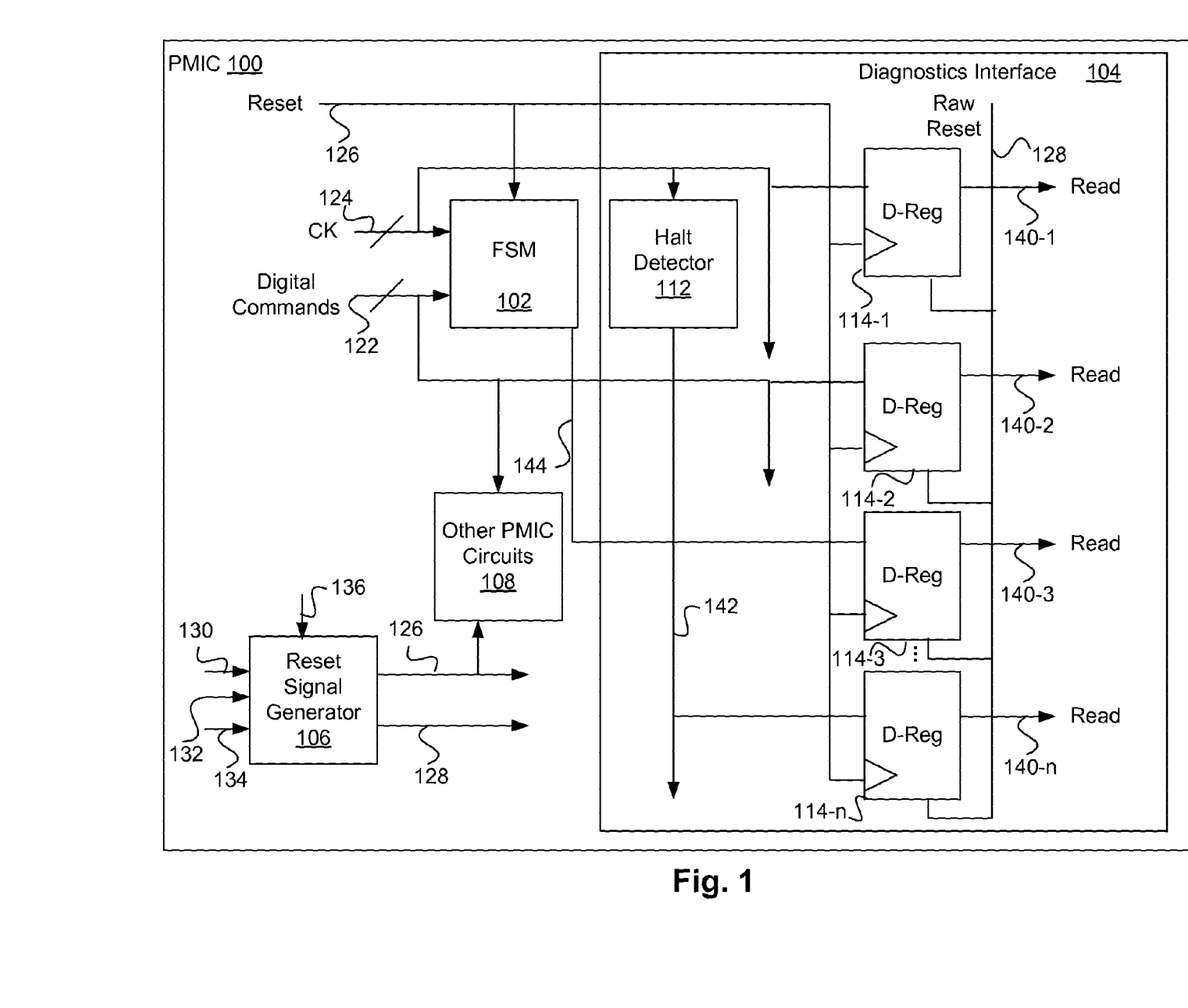
FIG. 1 illustrates a block diagram of a power management integrated circuit (PMIC) according to an embodiment.

FIG. 1 illustrates a block diagram of a power management integrated circuit (PMIC) 100 according to an embodiment. PMIC 100 comprises one or more finite state machines (FSM) 102, a diagnostics interface 104, a reset signal generator 106, and other PMIC circuits 108. PMIC 100 can be part of a device, such as a mobile phone or tablet.

FSM 102 receives a plurality of digital command signals 122 and one or more clock (CK) signals 124. The digital command signals 122 may be synchronous or asynchronous inputs, for example. If any of the input signals (digital command signals 122 or clock signals 124) to FSM 102 become invalid due to a fault condition, FSM 102 can stay in a stuck state and not respond to external power or trigger inputs because of an error condition, a defect, or other abnormal condition in FSM 102. The state of signals, registers, and clocks of FSM 102 can be provided to diagnostics interface 104 as is described below.

Diagnostics interface 104 comprises a halt detector 112 and one or more diagnostic registers (D-Reg) 114-1 through 114-n. Diagnostics interface 104 provides test access to the PMIC infrastructure internal signals via read signals 140-1 through 140-n from diagnostic registers 114-1 through 114-n, respectively, during a fault condition for debug and root cause analysis. Halt detector 112 generates a halt detection signal 142 in response to detection of a halt of clock signals 124. In some embodiments, halt detector 112 is an analog clock-less circuit. In this example, one halt detector 112 is shown. However, in some embodiments, one or more halt detectors 112 can be used on each module of PMIC 100. For example, one halt detector 112 can be used on a power on (PON) module and one halt detector 112 can be used on each infrastructure module of PMIC 100.

Diagnostic registers 114 store and maintain the signal states for the digital command signals 122, the clock states of the clock signals 124 in response to a reset signal 126, and the state 142 (such as signal states and register states) of FSM 102. In some embodiments, the storing may be limited to asynchronous input signals and clock signals on a power management integrated circuit, such as on a power on (PON) module.

In one embodiment, halt detector 112 monitors the clock signals 124 for FSM 102 locally within the PON module and other infrastructure modules and stores the clock states in one or more diagnostic registers 114 when the clock signal 124 fails. In various embodiments, diagnostic registers 114 maintain the plurality of signal states and clock states after the electronic device is powered down. Diagnostic registers 114 can receive a different reset signal (e.g., a raw reset signal 128) generated when a battery is removed, for example, to clear the stored signal states and clock states. Thus, diagnostic registers 114 maintain the state information after FSM 102, PMIC 100, and the electronic device are turned off and restarted unless cleared by the raw reset signal 128.

In this example, diagnostic register 114-1 stores the state of clock signal 124. Diagnostic register 114-2 stores the state of digital commands 122. Diagnostic register 114-3 stores the state 142 of FSM 102, such as FSM state critical signals. Diagnostic register 114-n stores the state of halt detection signal 142. Halt detector 112 is described in more detail in conjunction with FIG. 3.

Diagnostic registers 114 can be coupled to an interface, such as a system power management interface (SPMI), so that diagnostic registers 114 can be read without PMIC 100 being powered back on. If a lock up failure of FSM 102 results in damage to PMIC 00 that prevents full recovery and power back up after a hard reset, the ability to read the states from diagnostic registers 114 may provide useful information about the cause of the failure.

Reset signal generator 106 generates the reset signal 126 and the raw reset signal 128 in response to a main battery voltage 130, a charger pre-regulator voltage 132, a backup battery voltage 134, and a hard reset key signal 136. In this example, reset signal generator 106 generates reset signal 126 if voltages from both the main battery and the charger pre-regulator are below a first threshold (e.g., 2.1 Volts). Reset signal generator 106 generates raw reset signal 128 if voltages from both the main battery and a backup battery are below a second threshold (e.g., 1 Volt). Reset signal generator 106 is described in more detail in conjunction with FIG. 2.

Other PMIC circuits 108 can include a power on module, a battery charger, a battery fuel gauge, a real time clock (RTC), and other infrastructure modules or circuits.

Initially, PMIC 100 may be powered in an ON state. If a module in PMIC 100, such as a power on (PON) module or other infrastructure module, loses a clock signal 124 or is stuck in a particular state, a user may produce a hard key reset signal 136 to recover the device (e.g., by pressing a reset or power button on an electronic device). The hard key reset 136 may be received as reset 126 via reset signal generator 106 by FSM 102 to power off all registers and clear all logic and power down PMIC 100 and the electronic device, for example. The reset signal 126 is also used to store signal states for the digital command signals 122 and the clock signal 124 in diagnostic registers 114. For example, a rising edge of the reset signal 126 may latch the signal states and clock states in diagnostic registers 114.

A user may press the reset button again to power up the electronic device, PMIC 100, and FSM 102, which may restore FSM 102 into a predetermined operational state (a default state). The signal states and clock states may then be retrieved from diagnostic registers 114 and analyzed to determine the root cause of the failure. In an illustrative example described in more detail in conjunction with FIG. 5, diagnostic registers 114 may indicate that a power on module (PON) was in a particular state with no clock signal 124 and other particular signal states during the time the device was locked up, which may provide useful information in determining the cause of the lockup.

Figure 2:
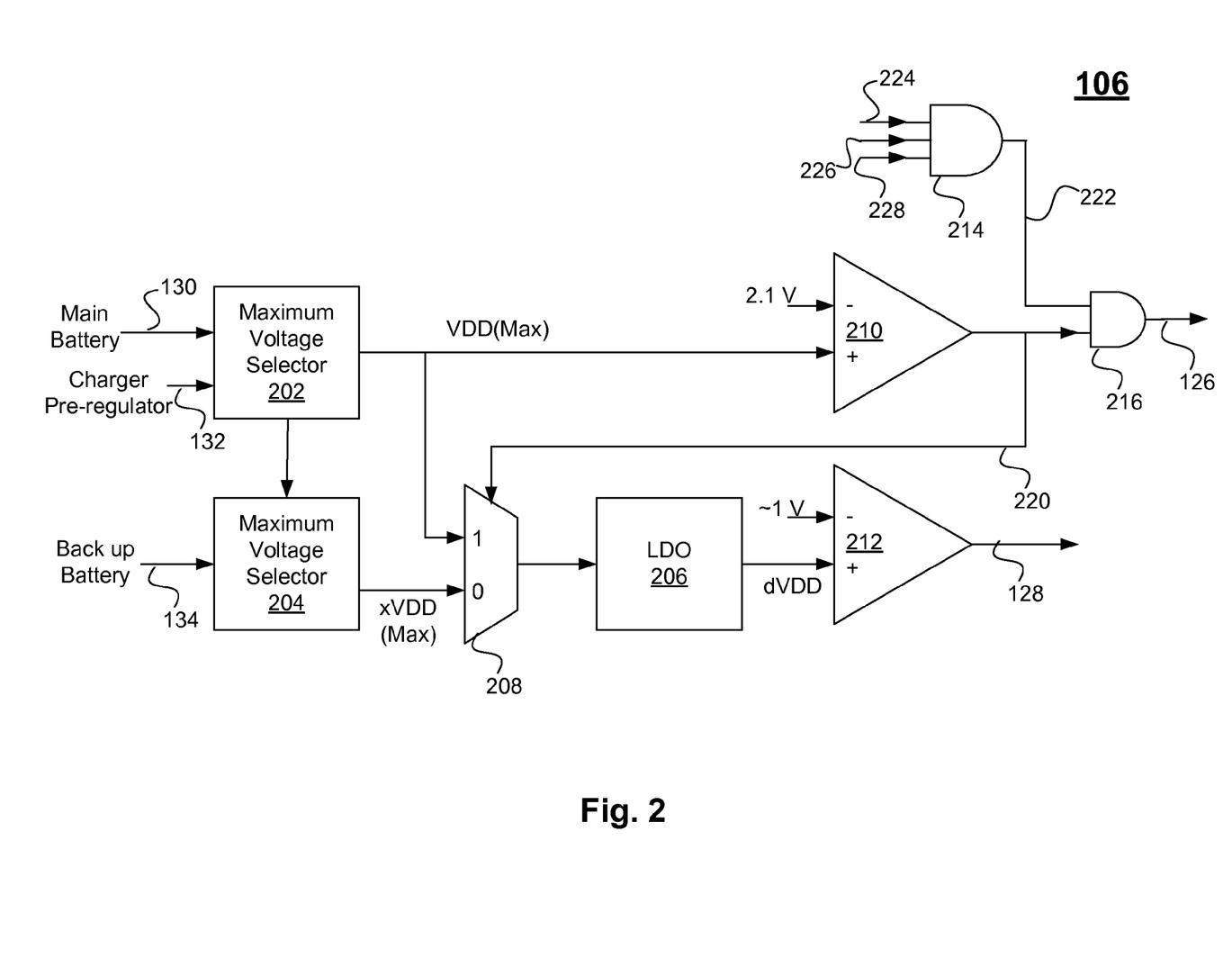
FIG. 2 illustrates a block diagram of a reset signal generator according to an embodiment.

FIG. 2 illustrates a block diagram of reset signal generator 106 according to an embodiment. Reset signal generator 106 comprises a plurality of maximum voltage selectors 202 and 204, a low-dropout (LOD) regulator 206, a multiplexer 208, a plurality of comparators 210 and 212, and a plurality of AND gates 214 and 216. Maximum voltage selector 202 generates a maximum VDD voltage VDD(Max) in response to the main battery voltage 130 and the charger pre-regulator voltage 132. This voltage is the main battery voltage 130 if a charger is not connected to the device. Maximum voltage selector 204 generates a maximum VDD voltage xVDD (Max) in response to the maximum VDD voltage VDD (Max) and the backup battery voltage 134. This voltage is the backup battery voltage 134 if the main battery is disconnected, discharged, or weak and the charger is not connected to the device.

Comparator 210 compares the maximum VDD voltage VDD(Max) to a first reference voltage, and in accordance therewith, generates a main battery supply dependent reset 220. In this example, the first reference voltage is 2.1 Volts. In this example, the main battery supply dependent reset 220 is high (e.g., '1') in an out of reset state and low (e.g., '0') in a reset state. The main battery supply dependent reset 220 is provided to multiplexer 208 and AND gate 216.

AND gate 214 generates a global reset trigger 222 in response to a hard reset key trigger 224, an over-temperature trigger 226 and watchdog timer 228. In this example, the hard reset key trigger 224, the over-temperature trigger 226 and the watchdog timer 228 reset low. AND gate 216 generates the reset signal 126 in response to global reset trigger 222 and main battery supply dependent reset 220. In this example, the reset signal 126 resets low.

The maximum VDD voltage VDD(Max) from maximum voltage selector 202 and the maximum VDD voltage xVDD (Max) from maximum voltage selector 204 are provided to respective inputs of multiplexer 208. Responsive to a high state or a low state of the main battery supply dependent reset 220, multiplexer 208 provides maximum VDD voltage VDD(Max) or maximum VDD voltage xVDD(Max), respectively, to LDO regulator 206. Responsive to the received voltage, LDO regulator 206 provides a voltage dVDD to comparator 212.

Comparator 212 compares the voltage dVDD to a second reference voltage, and in accordance therewith, generates the raw reset signal 128. In this example, the second reference voltage is about 1 Volt. In this example, the raw reset signal 128 is high (e.g., '1') in an out of reset state and low (e.g., '0') in a reset state.

Figure 3:
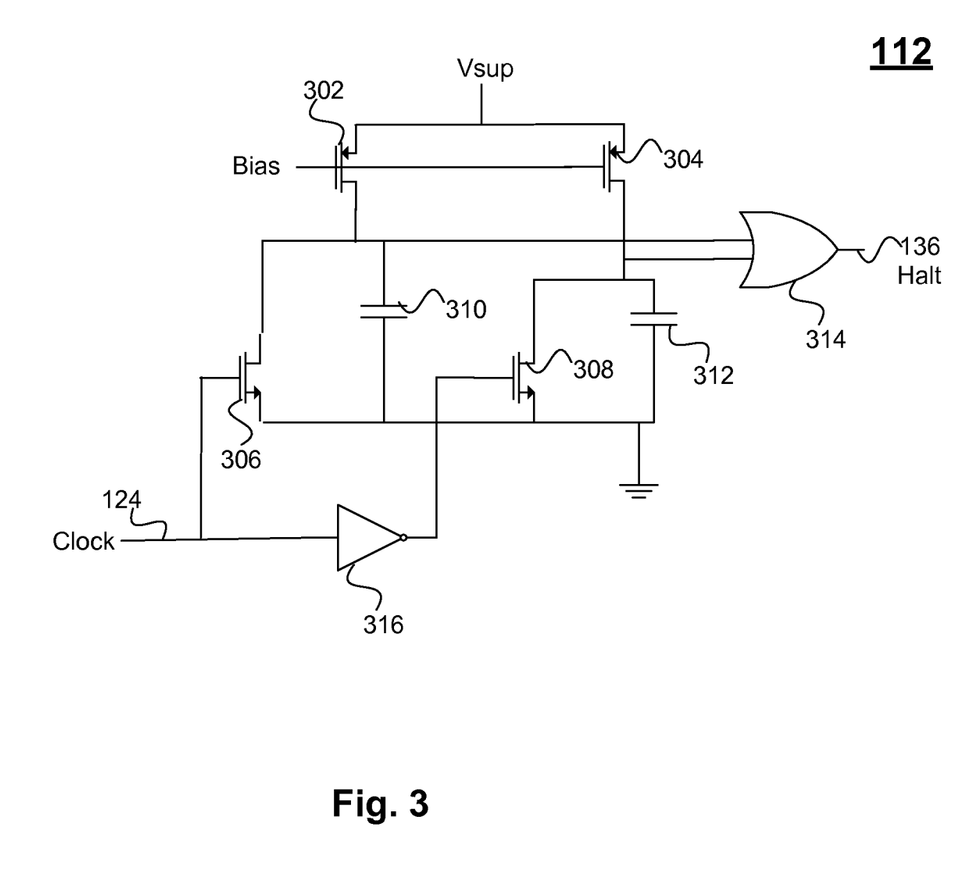
FIG. 3 is a block diagram illustrating a halt detector according to an embodiment.

FIG. 3 is a block diagram illustrating a halt detector 112 according to an embodiment. Halt detector 112 comprises a plurality of PMOS transistors 302 and 304, a plurality of NMOS transistors 306 and 308, a plurality of capacitors 310 and 312, an OR gate 314 and an inverter 316. PMOS transistors 302 and 304 are biased to slowly charge capacitors 310 and 312, respectively. NMOS transistors 306 and 308 are coupled in parallel to capacitors 310 and 312, respectively, to selectively ground and discharge the respective capacitors 310 and 312 in response to clock signal 124 or an inverted clock signal 124, respectively. While the clock signal 124 runs, capacitors 310 and 312 never fully charge. However, if the clock signal 124 stops, then either the clock signal 124 or the inverted clock signal 124 is low, and one of the NMOS transistors 306 and 308 is off. Accordingly, one of the capacitors 310 and 312 is not discharged, and charges and triggers the output of OR gate 314 to generate the halt detection signal 142 to indicate the detection of a halt of clock signal 124.

In various embodiments, halt detector 112 can include a counter for counting the number of relaxation-oscillator pulses in a clock cycle. Halt detector 112 can determine if the clock signal 124 is properly running based on whether the number of pulses is within a certain range. In this example, the range is 256-1,024 pulses.

Figure 4A:
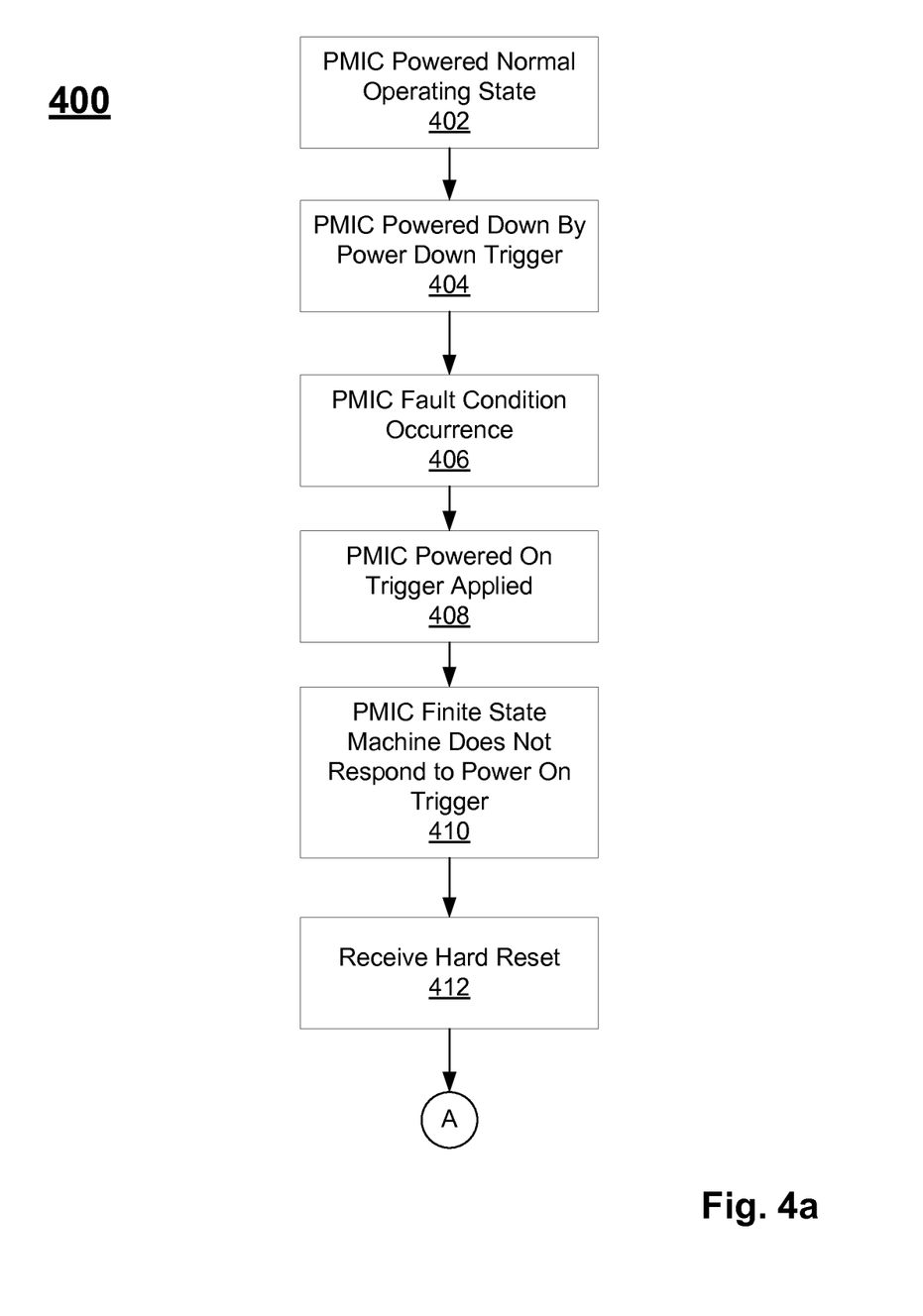
FIGS. 4a and 4b illustrate simplified diagrams illustrating a process flow for controlling diagnostics according to an embodiment.
Figure 4B:
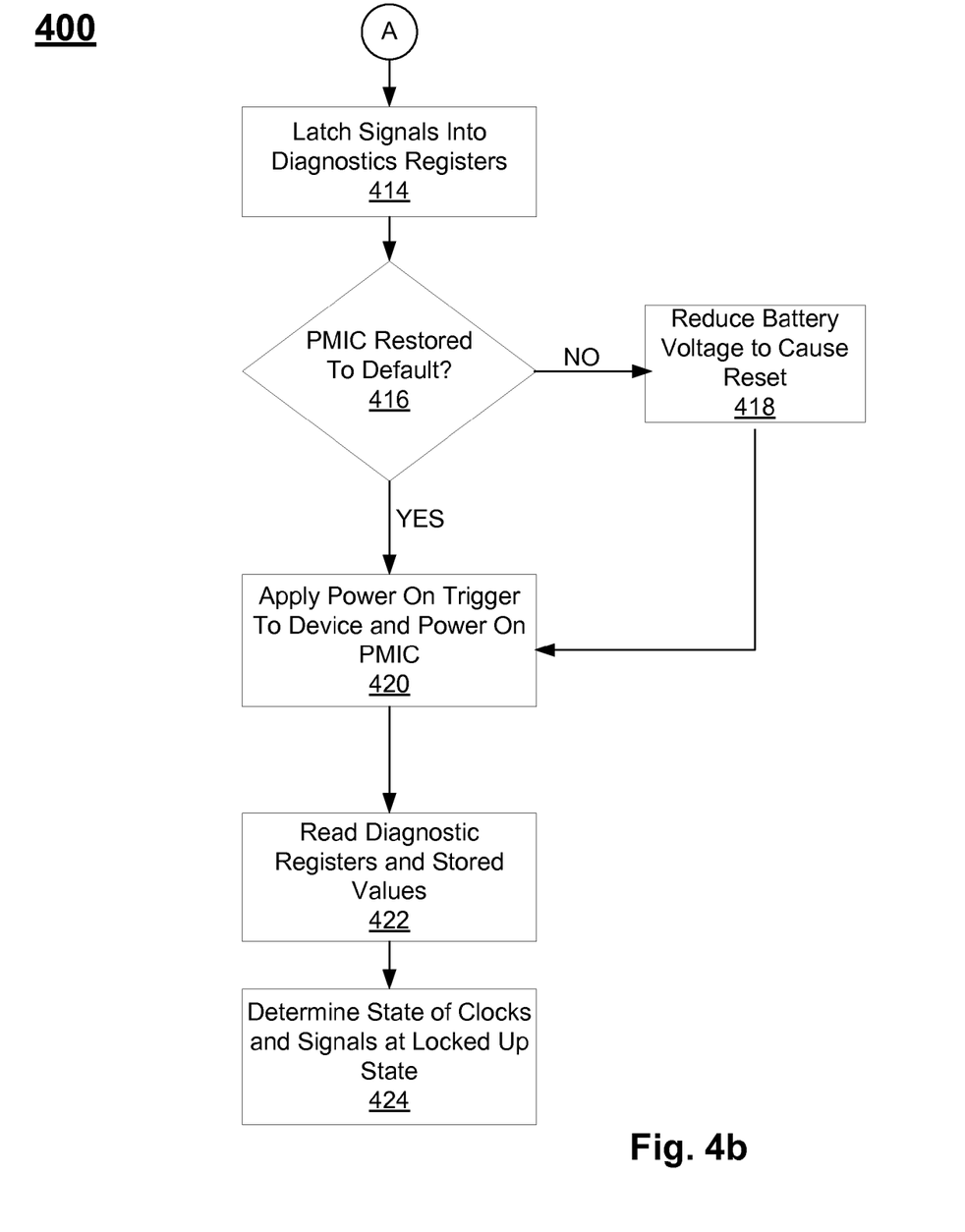

FIGS. 4a and 4b illustrate simplified diagrams illustrating a process flow 400 for controlling diagnostics according to an embodiment. At 402, PMIC 100 is powered on and operating in a normal state. At 404, PMIC 100 receives a power down trigger and powers down. The power down trigger may be, for example, keypad power down (KYPD-PWR_N), an undervoltage-lockout (UVLO), or other power down trigger. At 406, a PMIC fault condition occurs. The PMIC fault condition, at 406, can also occur while the device is powered on. Power down by hard reset at 404, can occur after the fault condition, at 406, has already occurred. The PMIC fault condition may be, for example, power on clock stops or FSM synchronous or asynchronous input signal transitions to an improper state. At 408, a PMIC powered on trigger is applied to PMIC 100. At 410, FSM 102 does not respond to the power on trigger and sits idle in an unknown state with unknown inputs. At 412, a hard reset 126 is received. At 414, diagnostic registers 114 latch the state of FSM 102, clock halt detect, and digital commands 122 on falling edge of hard reset key signal 136. If at 416, the hard reset 126 does not restore PMIC 100 to a default state, at 418, PMIC 100 reduces the battery voltage to 2 Volts to cause the reset signal 126 to reset via a power removal. Otherwise, if at 416, the hard reset 126 restores PMIC 100 to a default state, at 420, a power on trigger is applied to the device and power is applied to PMIC 100 and the device. At 422, stored values in diagnostic registers 114 are read. At 424, the state of the clock signals 124, state of signals 122, and states 142 at the locked up time are determined.

Figure 5:
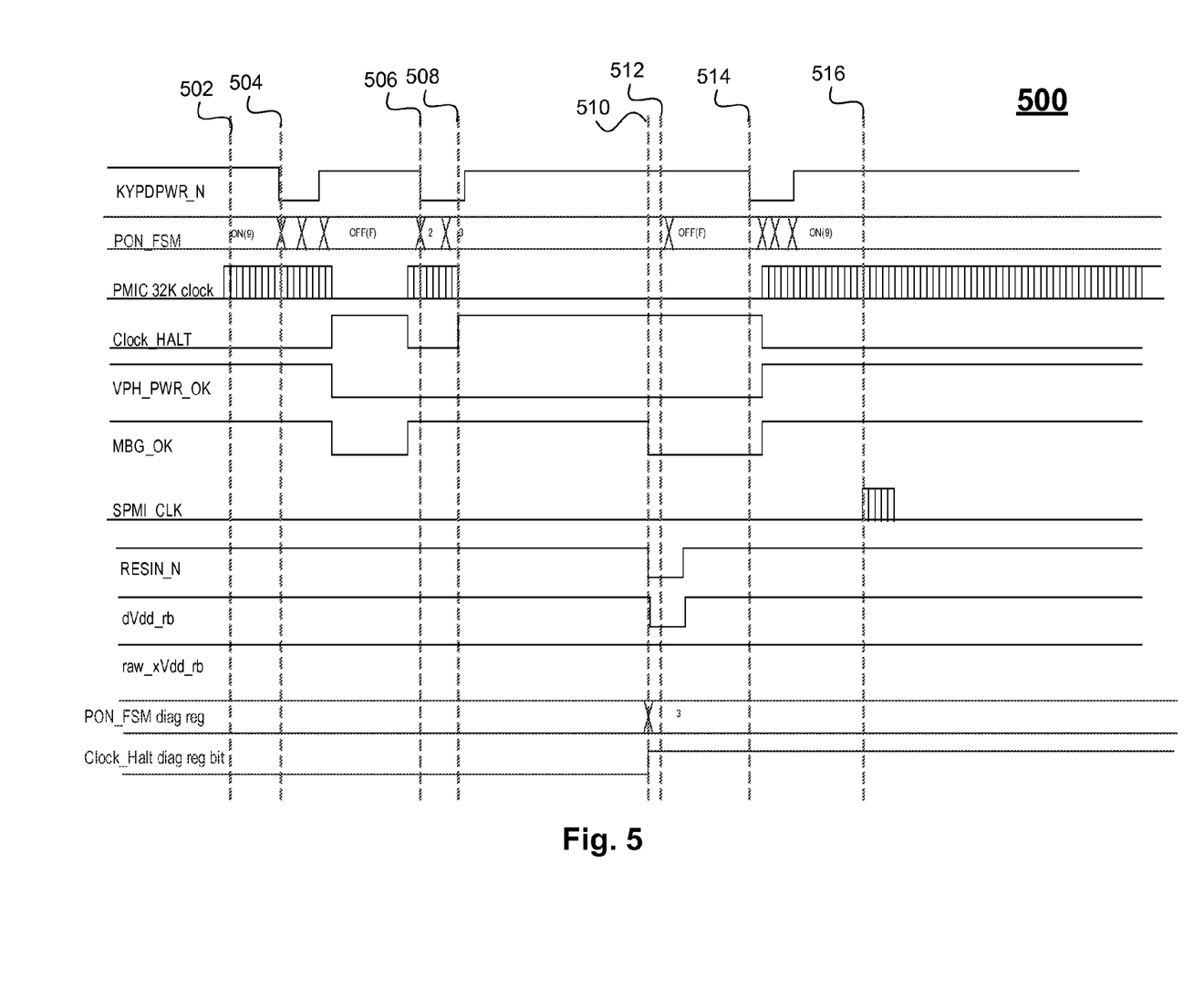
FIG. 5 illustrates a timing diagram of a power management integrated circuit according to an embodiment.

FIG. 5 illustrates a timing diagram 500 of PMIC 100 according to an embodiment. At a time 502, PMIC 100 is powered on. The clock signal 124 (shown as PMIC 32K clock in FIG. 5) to the power on (PON) FSM 102 is normal. Two status signals corresponding to two states 142, namely system (phone) power ready signal (VPH_PWR_OK) and master bandgap ready signal (MBG_OK), are both high indicating that the system (phone) power voltage and the master bandgap reference voltage, respectively, are good.

At a time 504, PMIC 100 receives a power down signal, which is shown as Keypad Power Down (KYPDPWR_N), from an actuation of a keypad button of the device that powers down PMIC 100 and the device. The clock signal 124 (PMIC 32K clock) to the power on (PON) FSM 102 stops. A halted clock on the halt detection signal 142 (shown as Clock_HALT in FIG. 5) indicates the clock signal 124 has stopped. System (phone) power ready signal (VPH_P-WR_OK) and master bandgap ready signal (MBG_OK) are both low indicate that the system (phone) power voltage and the master bandgap reference voltage, respectively, are bad or off.

At a time 506, PMIC 100 receives a power up signal, which is shown as Keypad Power Down (KYPDPWR_N), from an actuation of a keypad button of the device that powers up PMIC 100 and the device. The clock signal 124 (PMIC 32K clock) to the power on (PON) FSM 102 is normal. System (phone) power ready signal (VPH_P-WR_OK) and master bandgap ready signal (MBG_OK) are low and high, respectively, indicating that the system (phone) power voltage and the master bandgap reference voltage, respectively, are off (or bad) and good, respectively.

At a time 508, a power on module of the device and the associated FSM 102 loses the clock signal 124 (PMIC 32K clock). In this example, power on module is stuck in a state 3 shown as PON FSM in FIG. 5. The clock signal 124 (PMIC 32K clock) to the power on (PON) FSM 102 stops. A halted clock on the halt detection signal 142 (Clock_HALT) indicates the clock signal 124 has stopped. System (phone) power ready signal (VPH_PWR_OK) and master bandgap ready signal (MBG_OK) are both low indicating that the system (phone) power voltage and the master bandgap reference voltage, respectively, are bad or off.

At a time 510, PMIC 100 receives the hard reset key signal 136 to recover the device. In this example, the hard reset key signal 136 is shown as signal RESIN_N. In this example, diagnostic registers 114 latch upon the falling edge of the hard reset (RESIN_N) signal 136.

At a time 512, PMIC 100 powers off, and FSM 102 and other PMIC circuits 108 are cleared in response to the reset signal 126 (shown as dVdd_rb reset). Diagnostic registers 114 are not cleared. In this example, the raw reset signal 128 (shown as raw_xVdd_rb) is not set to clear diagnostic registers 114.

At a time 514, PMIC 100 receives a power up signal, which is shown as Keypad Power Down (KYPDPWR_N), from an actuation of a keypad button of the device that powers back up PMIC 100 and the device with default settings. The clock signal 124 (PMIC 32K clock), system (phone) power signal (VPH_PWR_OK), and master bandgap ready signal (MBG_OK) operate as they did at 502.

At a time 516, diagnostic registers 114 are read to determine the state of PMIC 100 at time 508. In this example, diagnostic registers 114 are read via a system power management interface (SPMI) that is clocked by a SPMI_CLK clock. In this example, diagnostic registers 114 provide read signals 140 that indicate status of digital commands 122. Specifically, a power on diagnostic register (PON_FSM diag reg) signal indicates that the power on (PON) module was in state 3 with no clock at time 510, A clock halt diagnostic register (Clock_Halt diag reg) signal indicates that the halt detector 112 indicated a halted clock on the halt detection signal 142 (Clock_HALT) at time 510, Two status signals corresponding to two digital commands 122 indicate the digital command 122, namely system (phone) power signal (VPH_PWR_OK) and master bandgap ready signal (MBG_OK) were both high during the locked state indicating that the system (phone) power voltage and the master bandgap reference voltage, respectively, were good at time 510.

The above description illustrates various embodiments of the present disclosure along with examples of how aspects of the particular embodiments may be implemented. The above examples should not be deemed to be the only embodiments, and are presented to illustrate the flexibility and advantages of the particular embodiments as defined by the following claims. Based on the above disclosure and the following claims, other arrangements, embodiments, implementations and equivalents may be employed without departing from the scope of the present disclosure as defined by the claims.

What is claimed is:

1. A power management integrated circuit comprising:
   a finite state machine having a first terminal to receive a digital command signal, a second terminal to receive a clock signal, and a third terminal to receive a first reset signal to reset the finite state machine into a predetermined operational state;
   a plurality of diagnostic registers configured to receive the first reset signal and a second reset signal and to store a signal state of the digital command signal or a clock state of the clock signal, or both in response to the first reset signal, the diagnostic registers are configured to maintain the signal state or the clock state, or both after powering down of the power management integrated circuit in response to the first reset signal,
   wherein the plurality of diagnostics registers are not cleared in response to the first reset signal, and wherein the plurality of diagnostics registers are cleared in response to the second reset signal generated when battery power is removed from the power management integrated circuit; and
   a halt detector having an input to receive the clock signal and having an output to provide a halt detection signal to at least one diagnostic register to store the clock state in response to detection of a halt of the clock signal.

2. The power management integrated circuit of claim 1 wherein the diagnostic registers are configured to maintain the stored signal state or the stored clock state, or both upon power on of the power management integrated circuit.

3. The power management integrated circuit of claim 1 wherein the diagnostic registers are configured to allow retrieval of the stored signal state or the stored clock state, or both via a system interface while the power management integrated circuit is powered down.

4. The power management integrated circuit of claim 1 further comprising a reset signal generator to generate the first reset signal in response to a loss of main power to the power management integrated circuit.

5. The power management integrated circuit of claim 1 further comprising a reset signal generator to generate the first reset signal in response to a user selected power off to the power management integrated circuit.

6. The power management integrated circuit of claim 1 wherein the halt detector is an analog clockless circuit.

7. A method comprising:
receiving, on inputs of a finite state machine in a power management integrated circuit, a plurality of digital command signals or one or more clock signals, or both;
receiving a first reset signal to reset the finite state machine into a predetermined operational state;
receiving the first reset signal and a second reset signal in a plurality of diagnostic registers;
storing, in response to said first reset signal, a plurality of signal states of the plurality of digital command signals or one or more clock states of the one or more clock signals, or both in the plurality of diagnostic registers;
powering down the power management integrated circuit in response to said first reset signal, wherein the diagnostic registers maintain the plurality of signal states or the one or more clock states, or both after said powering down of the power management integrated circuit,
wherein the plurality of diagnostics registers are not cleared in response to the first reset signal, and wherein the plurality of diagnostics registers are cleared in response to the second reset signal generated when battery power is removed from the power management integrated circuit; and
providing a halt detection signal to at least one diagnostic register to store the one or more clock states of the one or more clock signals in response to detection of a halt of the clock signal.

8. The method of claim 7 further comprising:
powering on the power management integrated circuit; and
retrieving the plurality of signal states and the one or more clock states.

9. The method of claim 7 further comprising generating the first reset signal in response to a loss of main power to the power management integrated circuit.

10. A method comprising:
receiving, on inputs of a finite state machine in an electronic device, a plurality of digital command signals or one or more clock signals, or both;
receiving a first reset signal to reset the finite state machine into a predetermined operational state;
receiving the first reset signal and a second reset signal in a plurality of diagnostic registers;
storing, in response to said first reset signal, a plurality of signal states of the plurality of digital command signals or the one or more clock signals in the plurality of diagnostic registers, or both;
powering down the electronic device in response to said first reset signal;
maintaining the plurality of signal states in the diagnostic registers after said powering down of the electronic device,
wherein the plurality of diagnostics registers are not cleared in response to the first reset signal, and wherein the plurality of diagnostics registers are cleared in response to the second reset signal generated when battery power is removed from the electronic device; and
providing a halt detection signal to at least one diagnostic register to store the signal states of the one or more clock signals in response to detection of a halt of the clock signal.

11. The method of claim 10 further comprising:
powering on the electronic device; and
retrieving the plurality of signal states.

* * * * *